(12) United States Patent
Hoeppel et al.

(10) Patent No.: US 10,879,426 B2
(45) Date of Patent: Dec. 29, 2020

(54) CARRIER FOR A COMPONENT, COMPONENT AND METHOD FOR PRODUCING A CARRIER OR A COMPONENT

(71) Applicant: OSRAM OLED GMBH, Regensburg (DE)

(72) Inventors: Lutz Hoeppel, Alteglofsheim (DE); Matthias Sabathil, Regensburg (DE); Norwin Von Malm, Nittendorf (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/755,527

(22) PCT Filed: Sep. 8, 2016

(86) PCT No.: PCT/EP2016/071206
§ 371 (c)(1),
(2) Date: Feb. 26, 2018

(87) PCT Pub. No.: WO2017/045996
PCT Pub. Date: Mar. 23, 2017

(65) Prior Publication Data
US 2018/0261730 A1    Sep. 13, 2018

(30) Foreign Application Priority Data

Sep. 17, 2015   (DE) .................. 10 2015 115 722

(51) Int. Cl.
*H01L 33/00*    (2010.01)
*H01L 33/48*    (2010.01)
(Continued)

(52) U.S. Cl.
CPC ............ *H01L 33/486* (2013.01); *H01L 33/44* (2013.01); *H01L 33/56* (2013.01); *H01L 33/62* (2013.01);
(Continued)

(58) Field of Classification Search
CPC ....... H01L 33/486; H01L 33/56; H01L 33/52; H01L 2933/0033; H01L 2933/033
See application file for complete search history.

(56) References Cited

U.S. PATENT DOCUMENTS

2007/0025091 A1* 2/2007 Shimada ................. H05K 3/387
361/750
2010/0254098 A1* 10/2010 Tsukada ............ H01L 23/49827
361/748
(Continued)

FOREIGN PATENT DOCUMENTS

DE    102004039505 A1    6/2005
DE    102012217776 A1    6/2014
(Continued)

OTHER PUBLICATIONS

First Office Action dated Mar. 20, 2019, issued in Chinese Patent Application No. 201680049995.8.
(Continued)

*Primary Examiner* — Stephen M Bradley
*Assistant Examiner* — Wasiul Haider
(74) *Attorney, Agent, or Firm* — MH2 Technology Law Group LLP

(57) ABSTRACT

A mount (10) and an optoelectronic component (100) with the mount (10) are provided, wherein the mount (10) comprises a moulding (5), at least one through-contact (41, 42) and a plurality of reinforcing fibres (52), wherein the moulding (5) is formed from an electrically insulating moulding material (53), the through-contact (41, 42) is formed from an
(Continued)

Figure 1A:
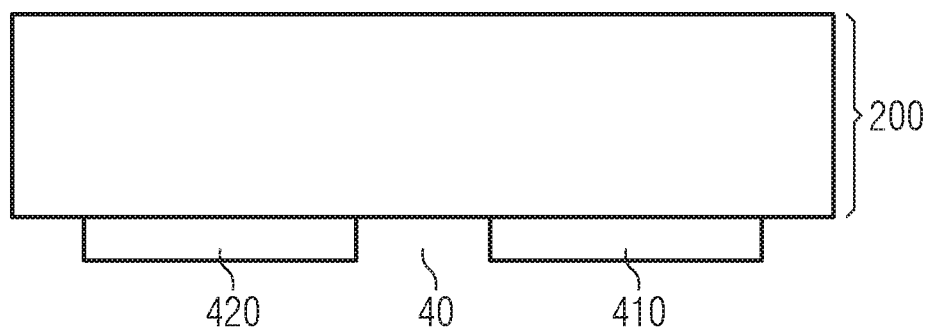

electrically conductive material, and the reinforcing fibres (52) produce a mechanical connection between the moulding (5) and the through-contact (41, 42) by the reinforcing fibres (52) being arranged in certain regions of the moulding (5) and arranged in certain regions of the through-contact (41, 42). A method for producing a mount or a component with such a mount is also provided.

14 Claims, 7 Drawing Sheets

(51) Int. Cl.
    *H01L 33/44*     (2010.01)
    *H01L 33/56*     (2010.01)
    *H01L 33/62*     (2010.01)
    *H01L 33/52*     (2010.01)

(52) U.S. Cl.
    CPC ...... *H01L 33/52* (2013.01); *H01L 2933/0033* (2013.01); *H01L 2933/0066* (2013.01)

(56) References Cited

U.S. PATENT DOCUMENTS

| | | | | |
|---|---|---|---|---|
| 2011/0108870 A1* | 5/2011 | Jaeger | ............... | H01L 33/483 |
| | | | | 257/98 |
| 2013/0168134 A1* | 7/2013 | Tominaga | ............ | H05K 3/4673 |
| | | | | 174/251 |
| 2013/0189483 A1* | 7/2013 | Reinmuth | .............. | H05K 13/00 |
| | | | | 428/137 |
| 2014/0014990 A1* | 1/2014 | Kim | ........................ | H01L 33/58 |
| | | | | 257/98 |
| 2014/0119813 A1* | 5/2014 | Moselage, III | ..... | B29C 66/1122 |
| | | | | 403/270 |
| 2014/0197436 A1 | 7/2014 | Kim | | |
| 2014/0306250 A1* | 10/2014 | Gardner | .............. | H01L 25/0753 |
| | | | | 257/89 |
| 2015/0207046 A1 | 7/2015 | Ikegami et al. | | |
| 2015/0364653 A1* | 12/2015 | Chae | ..................... | H01L 33/405 |
| | | | | 257/98 |

FOREIGN PATENT DOCUMENTS

| | | |
|---|---|---|
| DE | 102013212294 A1 | 12/2014 |
| DE | 102014113313 A1 | 3/2015 |
| DE | 102013113616 A1 | 6/2015 |
| DE | 102014116935 A1 | 5/2016 |
| DE | 102015105509 A1 | 10/2016 |
| DE | 102015112280 A1 | 2/2017 |
| DE | 102015214222 A1 | 2/2017 |
| DE | 102015214228 A1 | 2/2017 |
| EP | 2393132 A2 | 12/2011 |
| JP | S64081390 A | 3/1989 |
| JP | 2008305906 A | 12/2008 |
| JP | 2009206250 A | 9/2009 |
| JP | 2010041045 A | 2/2010 |
| JP | 2012089646 A | 5/2012 |
| JP | 2012226021 A | 11/2012 |
| JP | 2013529853 A | 7/2013 |
| JP | 2013251417 A | 12/2013 |
| JP | 2014241400 A | 12/2014 |
| JP | 2015084415 A | 4/2015 |
| JP | 2015111636 A | 6/2015 |

OTHER PUBLICATIONS

Notification of Reasons for Refusal dated Mar. 4, 2019, issued in Japanese Patent Application No. 2018-510749.
Third Office Action in corresponding Chinese Application No. 20168004995.8 dated Sep. 24, 2020, 12 pages.

* cited by examiner

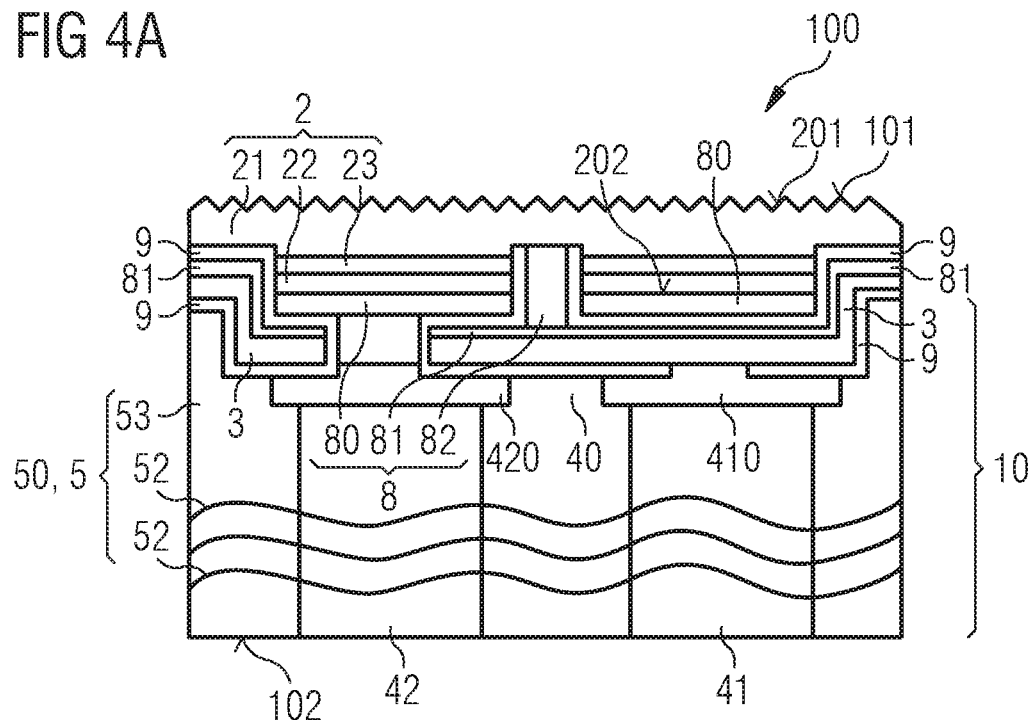
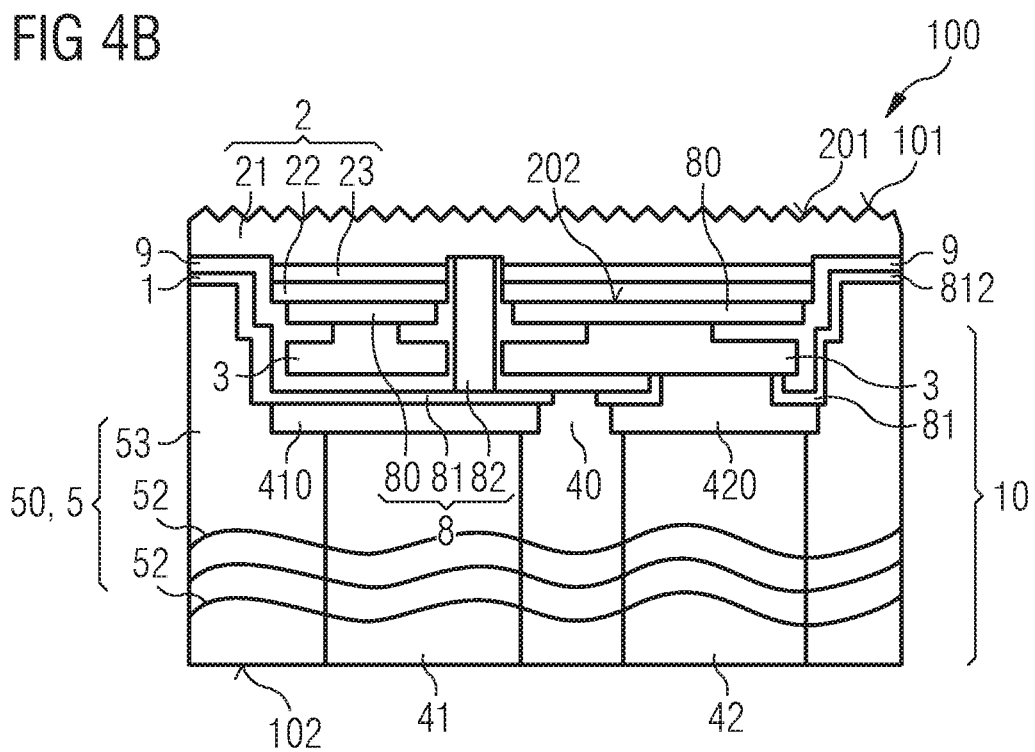

CARRIER FOR A COMPONENT, COMPONENT AND METHOD FOR PRODUCING A CARRIER OR A COMPONENT

A carrier for a component, a component and a method for producing a carrier or a component are provided.

Components comprising a multi-layered carrier often have insufficient mechanical stability due to poor adhesion between the layers or the adjoining integral parts of the carrier. One object is to provide a carrier and a component having a high mechanical stability. Furthermore, a cost-effective method for producing a carrier for a component or for producing a component comprising such a carrier is provided.

According to at least one embodiment of a carrier for an optoelectronic component, the carrier has a mold body and at least one through-contact. The mold body is formed in particular from an electrically insulating mold body material, for instance from a plastic material, for example from a pourable polymer such as a resin, epoxide or silicone. The through-contact is formed in particular from an electrically conductive material. The carrier has a front side and a rear side, wherein the front side and the rear side are formed in places in particular by surfaces of the mold body. The through-contact is preferably formed in such a way that the latter extends along the vertical direction through the mold body, for instance from the rear side to the front side of the carrier. In lateral directions, the through-contact can be completely enclosed by the mold body. The carrier can have a plurality of such through-contacts.

A vertical direction is understood to mean a direction which is transverse, in particular perpendicular to the front side and/or rear side of the carrier. A lateral direction is understood to mean a direction which extends parallel to the front side and/or rear side of the carrier. The vertical direction and the lateral direction are transverse, for instance perpendicular to one another.

According to at least one embodiment of the carrier, the carrier comprises a plurality of reinforcing fibers. The reinforcing fibers are preferably formed from an electrically insulating material. The reinforcing fibers can be fabric fibers or glass fibers. In particular, the reinforcing fibers establish a mechanical connection between the mold body and the through-contact. This means that the mold body and the through-contact are mechanically connected to one another in particular by the reinforcing fibers. In each case, the reinforcing fibers are preferably arranged in regions within the mold body and in regions within the through-contact. Here, it is not necessary for all of the reinforcing fibers located in the carrier to be embedded in each case in regions within the mold body and in regions within the through-contact.

Due to the reinforcing fibers, the mold body and the through-contact are mechanically connected to one another. Here, the through-contact can adjoin the mold body directly. In addition to the adhesion between the mold body and the through-contact, the mechanical connection between the mold body and the through-contact is particularly enhanced by the reinforcing fibers, which may result in a real rigid connection between the material of the through-contact and the material of the mold body. Here, the reinforcing fibers can partially penetrate into the through-contact or extend through the through-contact.

In at least one embodiment of the carrier, the carrier comprises a mold body, a through-contact and a plurality of reinforcing fibers, wherein the mold body is formed from an electrically insulating mold body material, the through-contact is formed from an electrically conductive material and the reinforcing fibers each are arranged in regions in the mold body and in regions in the through-contact, so that the reinforcing fibers establish a mechanical connection between the mold body and the through-contact.

Due to such an arrangement of the reinforcing fibers, a mechanically stable, in particular rigid connection between the mold body and the through-contact can be achieved. The mold body preferably contains adhesion promoters which are optimized for instance for materials of the through-contact, so that the mechanical connection between the mold body and the through-contact is enhanced by additional adhesive force.

According to at least one embodiment of the carrier, the mold body adjoins the through-contact. The reinforcing fibers can extend throughout an interface formed by the mold body and the through-contact. A high mechanical strength of the connection between the mold body and the through-contact can thus be achieved.

According to at least one embodiment of the carrier, the reinforcing fibers are mechanically connected, in particular cross-linked or braided to one another at least in places. The reinforcing fibers thus form, at least in regions, a web, for instance in the form of a net or a braid. The web is preferably located in regions in the mold body and in regions in one of the through-contacts. A part of the web located outside the through-contact may fully enclose the through-contact. Such a configuration of the reinforcing fibers leads to an increased mechanical stability of the carrier.

Alternatively, it is also possible for the reinforcing fibers to be present partially or entirely in loose form within the carrier, i.e. not directly mechanically connected to one another. Here, at least in some regions, the reinforcing fibers can form a fiber bundle which is located for instance in regions in the mold body and in regions in the through-contact or at the same time in a plurality of through-contacts.

According to at least one embodiment of the component, the carrier is formed in such a way that in the lateral direction the reinforcing fibers extend through the mold body and through the through-contact. The mold body can have side surfaces containing the reinforcing fibers. In particular, the side surfaces can comprise singulating traces which are observable, for example, on severed reinforcing fibers on the side surfaces.

According to at least one embodiment of the carrier, the carrier has a first through-contact and a second through-contact. An intermediate region is located in the lateral direction between the first and the second through-contacts, wherein the reinforcing fibers are located for instance in places in the intermediate region and mechanically connect the first through-contact to the second through-contact. In this case, the reinforcing fibers are arranged preferably in places both in the first through-contact and in the second through-contact. In the lateral direction, the first and the second through-contacts are laterally spaced apart from each other and electrically insulated from each other in particular by the mold body. In a plan view of the rear side or front side of the carrier, the first and the second through-contacts can be completely surrounded by the mold body in the lateral direction. In the intermediate region, the reinforcing fibers are preferably enclosed by the molding material of the mold body, so that the positions of the reinforcing fibers are fixed within the carrier.

According to at least one embodiment of the carrier, the mold body contains filler particles for adjusting the thermal expansion coefficient (CTE) of the carrier. The filler particles are in particular embedded in the mold body material. The filler particles can have a lower or greater coefficient of expansion in comparison to the mold body material. The filler particles are preferably CTE-reducing particles or spheres, so that the carrier is adjusted, for example, to a semiconductor body arranged on the carrier with regard to the coefficient of thermal expansion.

According to at least one embodiment of the carrier, the through-contact or the plurality of through-contacts is/are formed to be electrically connectable on the rear side of the carrier. Here, it is also possible for a contact layer or an electrically conductive protective layer or a plurality of such layers, which is/are in electrical contact with the through-contact and partially or completely covers/cover the through-contact, to be arranged on the rear side of the carrier. The through-contact or the plurality of through-contacts can likewise be electrically connectable on the front side of the carrier.

In at least one embodiment of a component, the component has a carrier and a semiconductor body, wherein the semiconductor body is arranged on the carrier. The carrier of the component is in particular the carrier described here comprising reinforcing fibers which are embedded in regions in the mold body and in regions in at least one through-contact of the carrier. The semiconductor body preferably has an active layer which, during operation of the component, is configured for instance for detecting or generating electromagnetic radiation. The component is electrically externally connectable in particular by the carrier, wherein the semiconductor body is electrically conductively connected to the at least one through-contact. The component is in particular a light-emitting diode.

The semiconductor body can comprise a first semiconductor layer of a first, for instance n-conducting charge carrier type and a second semiconductor layer of a second, for instance p-conducting charge carrier type. The first semiconductor layer and the second semiconductor layer can also be formed to be p-conducting and n-conducting, respectively. In particular, the active layer is a pn-junction zone. The semiconductor body can be applied to a growth substrate by means of an epitaxy method for instance in a layer-wise manner. The growth substrate can subsequently be removed from the semiconductor body, so that the component is in particular free of a growth substrate. Alternatively, it is also possible that the growth substrate is formed to be radiation-transmissive and, in addition to the carrier, the component can also comprise a radiation-transmissive growth substrate.

The semiconductor body has a first main surface, which is formed, for example, as a radiation passage area of the component. Furthermore, the semiconductor body comprises a second main surface facing away from the first main surface and for instance facing towards the carrier. The carrier is in particular formed to be opaque. The main surfaces of the semiconductor body can be formed by surfaces of the semiconductor layers of the semiconductor body.

According to at least one embodiment of the component, the component has a wiring structure which is arranged in particular in regions between the semiconductor body and the carrier along the vertical direction. The semiconductor body can be electrically conductively connected to the carrier by means of the wiring structure. The wiring structure is formed in particular in such a way that the first semiconductor layer and the second semiconductor layer of the semiconductor body are electrically conductively connected to the first through-contact and to the second through-contact of the carrier, respectively, by different partial regions of the wiring structure being electrically isolated from one another.

The component can have an isolation structure which electrically isolates for instance different partial regions of the wiring structure from one another. The wiring structure and the isolation structure can extend in places into the semiconductor body. The wiring structure preferably has a through-via which extends for instance from the second main surface through the second semiconductor layer and the active layer into the first semiconductor layer for electrically contacting the first semiconductor layer. Here, the through-via can be electrically isolated from the second semiconductor layer and from the active layer by the isolation structure. For improving the current distribution, the wiring structure can also have a plurality of such through-vias. Furthermore, the wiring structure can have an electrically conductive and radiation-reflecting mirror layer which is formed from a metal, for example. The mirror layer can be electrically conductively connected to the through-via or to the plurality of through-vias.

According to at least one embodiment of the component, the component has a stabilization layer which is arranged for instance between the semiconductor body and the carrier. In a plan view of the carrier, the stabilization layer can laterally bridge the intermediate region located between the first through-contact and the second through-contact. The stabilization layer may be formed as part of the wiring structure. For example, the stabilization layer is an electrically conductive metal layer which is electrically conductively connected to the first through-contact or to the second through-contact of the carrier. By laterally bridging the intermediate region, in a plan view, the stabilization layer can have overlaps with the first through-contact, the intermediate region and the second through-contact, and mechanically stabilizes the component along the lateral direction, in particular in the region of the intermediate region.

According to at least one embodiment of the component, the carrier is produced directly on the semiconductor body. This means that the carrier, for example, is not produced in a production step separate from the semiconductor body and is subsequently fixed to the semiconductor body, but rather is directly applied onto the semiconductor body or onto the wiring structure and thus is formed directly on the semiconductor body. The component comprising the carrier and the semiconductor body can thus be produced on wafer-level in a simplified manner, for example in a wafer composite. Due to the processing in the wafer composite, it is inter alia not necessary to produce the carrier of the component separately, apply the semiconductor body onto such separately produced carriers and electrically connect the semiconductor body therewith. Mounting steps of this type with regard to individual chip processes, which represent a considerable proportion of the overall production costs of components, can be dispensed with, as a result of which the component is produced in a cost-effective manner.

In at least one embodiment of a method for producing a carrier, a mold body composite is provided which comprises a plurality of reinforcing fibers embedded in a matrix material. At least one opening is formed in the mold body composite by a partial and selective removal of the matrix material, such that the reinforcing fibers are exposed in regions. The reinforcing fibers are for instance freely suspended in the area of the opening. For forming a through-contact the opening can be filled with an electrically conductive material, as a result of which the reinforcing fibers, which are exposed in regions in the opening, are surrounded by the electrically conductive material, so that the reinforcing fibers penetrate into the through-contact along the lateral direction. In particular, the reinforcing fibers can extend throughout the through-contact along the lateral direction.

By the selective removal, only the matrix material in the mold body composite made of the matrix material and the reinforcing fibers is removed in places, so that the remaining reinforcing fibers are exposed in regions due to the removal of the matrix material. The matrix material can be a selectively structurable, for instance selectively etchable material. The matrix material can be selected in such a way that the remaining matrix material located outside the opening or openings can form the mold body of the carrier. In other words, the matrix material can be used as the mold body material. Here, the remaining matrix material can be cured, so that the mold body formed from the remaining matrix material is sufficiently mechanically stable, in order to be able to remain on the component during its service life. The remaining matrix material is preferably selected with regard to its material in such a way that the thermal expansion coefficients of the mold body or of the carrier and of the semiconductor body are adjusted to one another. For this purpose, the matrix material can have filler particles for adjusting the coefficient of thermal expansion.

Alternatively, it is possible to embed the reinforcing fibers in a selectively structurable material, such as a photostructurable material. In this case, the matrix material can be a photoactive lacquer which can be structured, for example, by exposure to light. After forming the through-contact or a plurality of through-contacts, the matrix material can be completely removed.

According to at least one embodiment of the method, after the forming of the through-contact or of the through-contacts, the matrix material is removed for exposing further regions of the reinforcing fibers adjoining for instance the through-contact or the plurality of through-contacts. The further exposed regions of the reinforcing fibers can be re-filled with an electrically insulating mold body material. In this sense, the matrix material remaining after the formation of the through-contacts is at least partially or completely replaced by the electrically insulating mold body material. Here, for forming the mold body of the carrier, the mold body material can be applied to the exposed further regions of the reinforcing fibers in such a way that the further regions of the reinforcing fibers are surrounded by the mold body material, as a result of which the reinforcing fibers are arranged in each case in regions in the mold body and in regions in the through-contact. Thus, a mechanical, in particular rigid connection between the mold body and the through-contact is formed due to the reinforcing fibers.

According to at least one embodiment of the method, the mold body composite is formed layer-wise prior to the formation of the through-contact or the through-contacts, wherein a first layer made of the matrix material is provided and the reinforcing fibers are applied to the first layer or pressed into the first layer. Subsequently, a further layer made of the matrix material can be applied to the first layer or to the reinforcing fibers, whereupon further reinforcing fibers are applied to the further layer or pressed into the further layer. This process can be repeated several times, so that a mold body composite comprising a plurality of matrix material layers having reinforcing fibers located therein is formed.

According to at least one embodiment of the method, the reinforcing fibers are mechanically connected to one another to form a web at least in regions. For example, the reinforcing fibers are cross-linked or braided with one another. Such a configuration of the reinforcing fibers simplifies the application of the reinforcing fibers to the layer made of the matrix material and at the same time increases the mechanical stability of the carrier to be produced. The reinforcing fibers can be present in the form of a net before being applied to the layer made of the matrix material. Alternatively, it is also possible for the reinforcing fibers to be provided in loose form and applied to the layer made of the matrix material.

According to at least one embodiment of a method for producing a plurality of components, a wafer composite comprising a semiconductor composite is provided. The semiconductor composite can be divided into a plurality of semiconductor bodies, each having an active layer. For producing a carrier or a carrier composite comprising a plurality of carriers, a mold body composite is applied to the wafer composite or is formed in layers on the wafer composite. After the formation of the through-contact or the through-contacts, the wafer composite and the mold body composite can be singulated into a plurality of components in such a way that each of the components has one of the semiconductor bodies, which is arranged on an associated carrier, wherein the associated carrier has an electrically insulating mold body, at least one or a plurality of electrically conductive through-contacts and reinforcing fibers. The reinforcing fibers are each arranged in regions in the mold body and in regions in the through-contact and thus establish for instance a mechanical connection between the mold body and the through-contact.

The methods described above are particularly suitable for the production of a carrier or a component described here. Features described in connection with the carrier or component can therefore also be used for the methods for the production of a carrier or a component described here, and vice versa. Moreover, the carrier described here is particularly suitable for a carrier of the component described here, such that features described in connection with the carrier can also be used for the component, and vice versa.

Further advantages, preferred embodiments and further developments of the carrier, the component as well as of the production thereof will become apparent from the exemplary embodiments explained below in conjunction with FIGS. 1A to 4B.

Figure 1B:
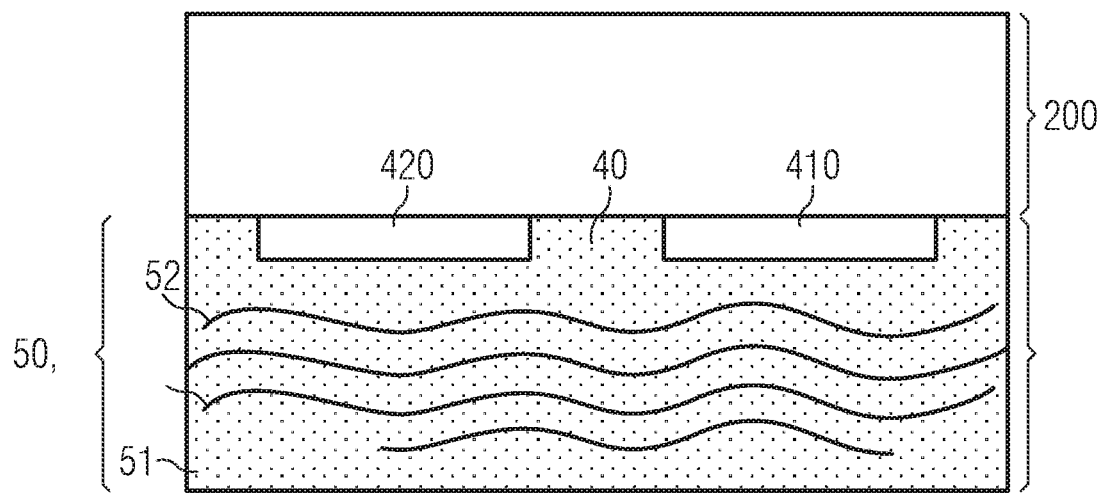
Figure 1C:
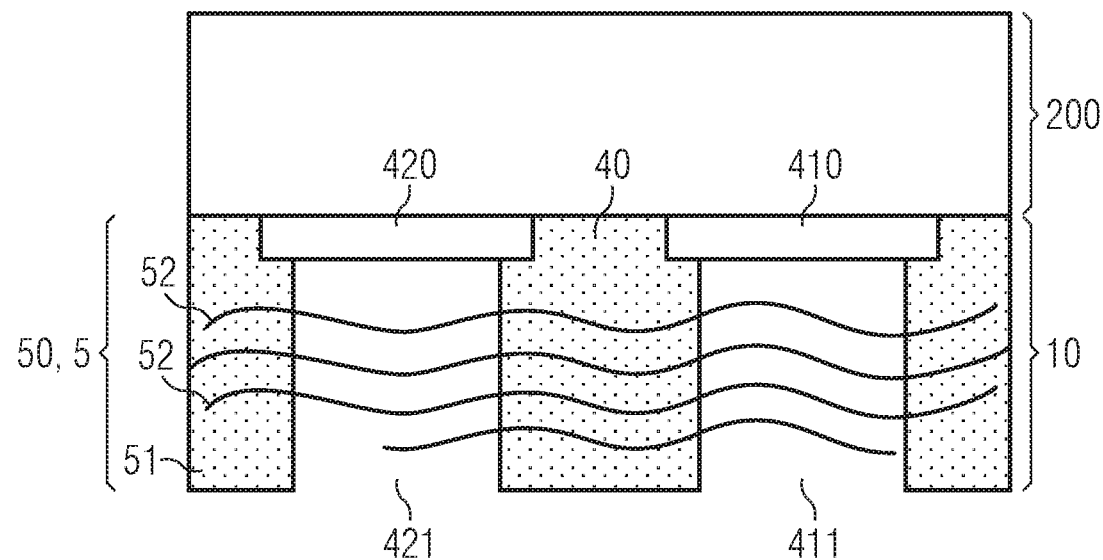
Figure 1D:
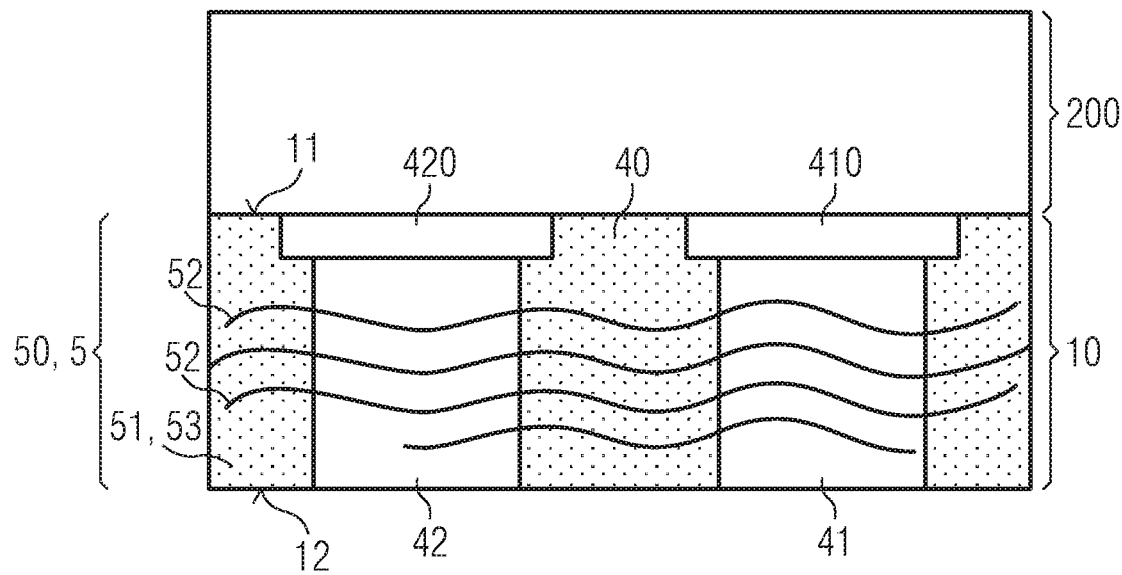
Figure 1E:
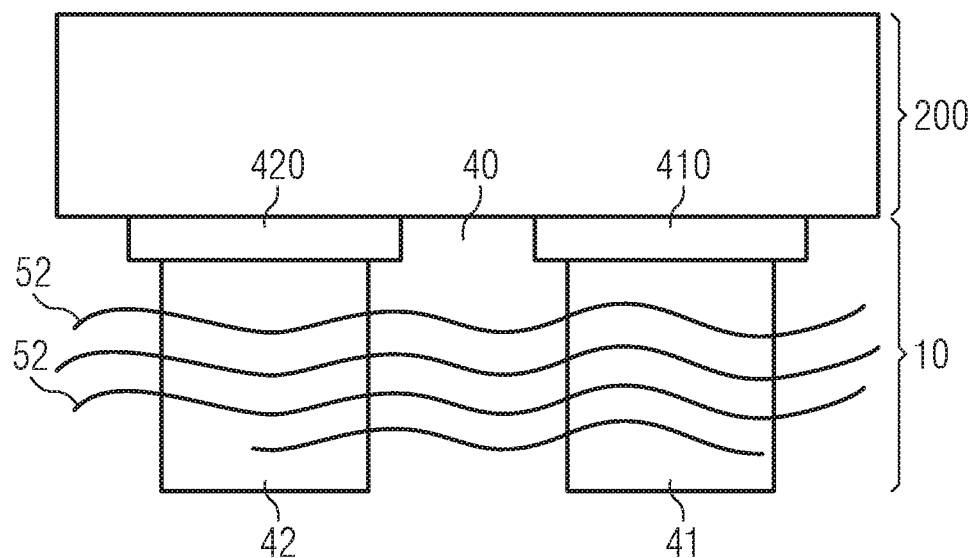
Figure 1F:
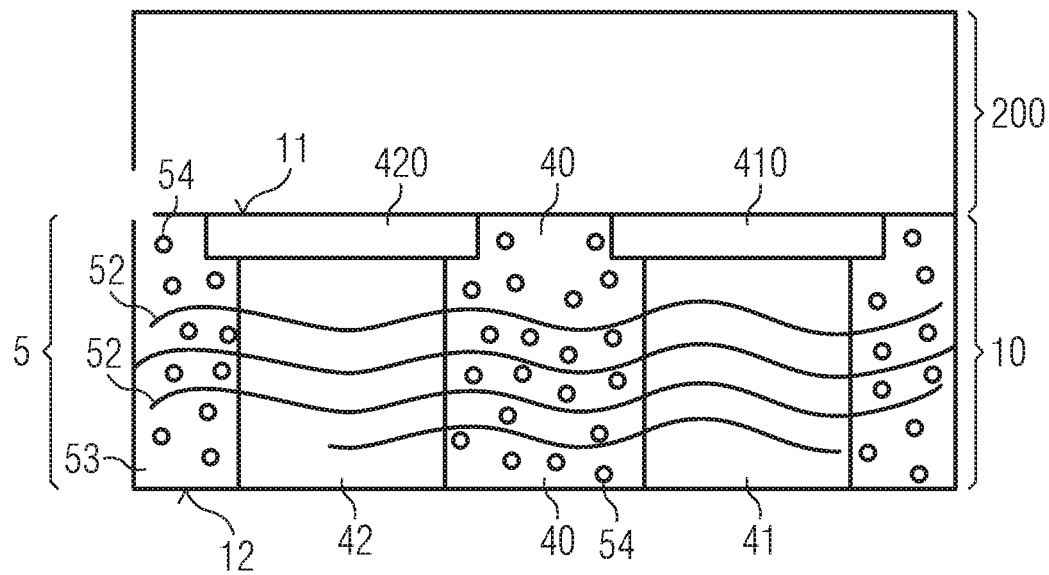
Figure 2A:
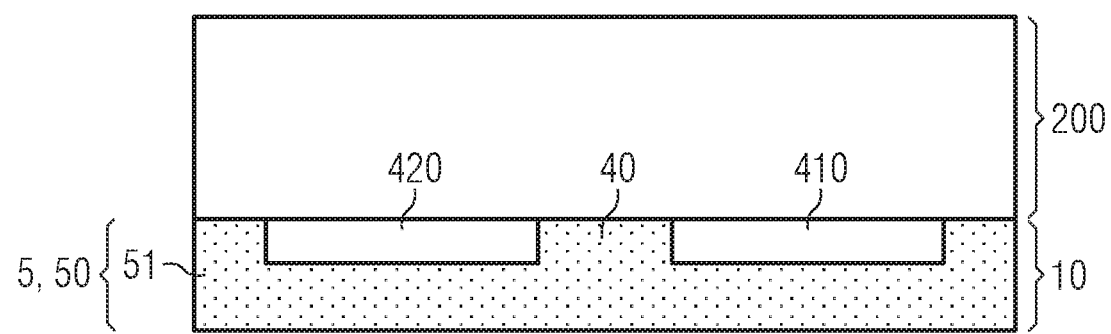
Figure 2B:
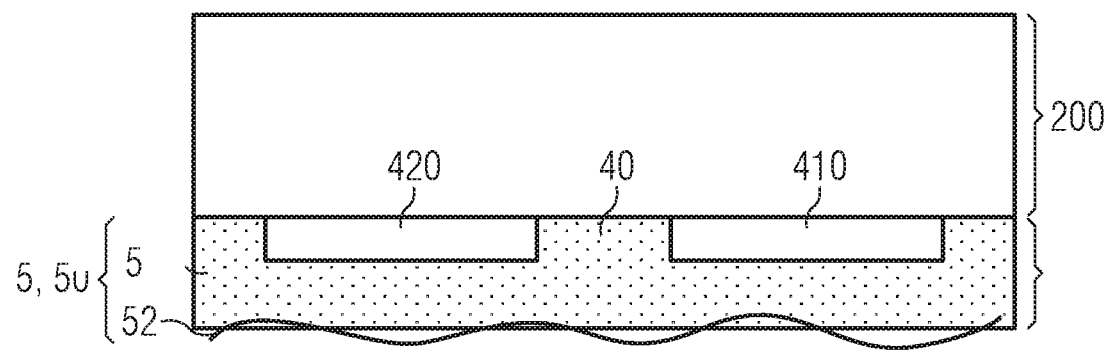
Figure 2C:
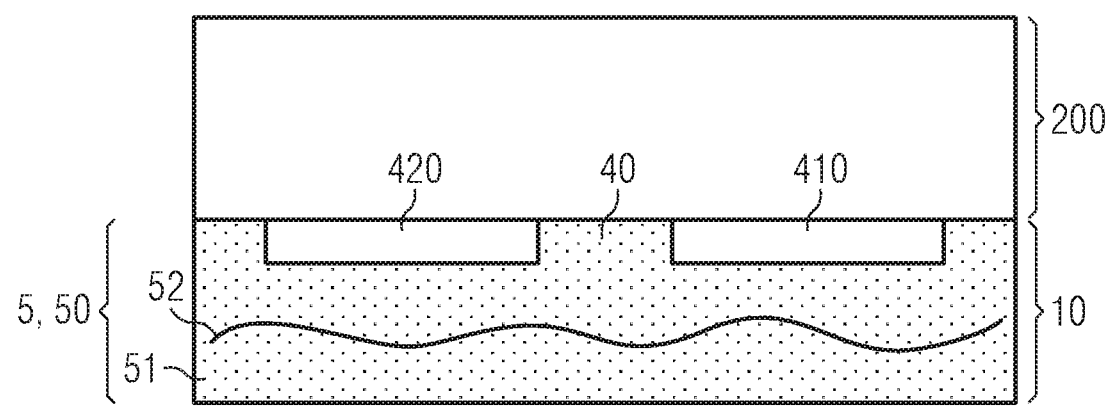
Figure 2D:
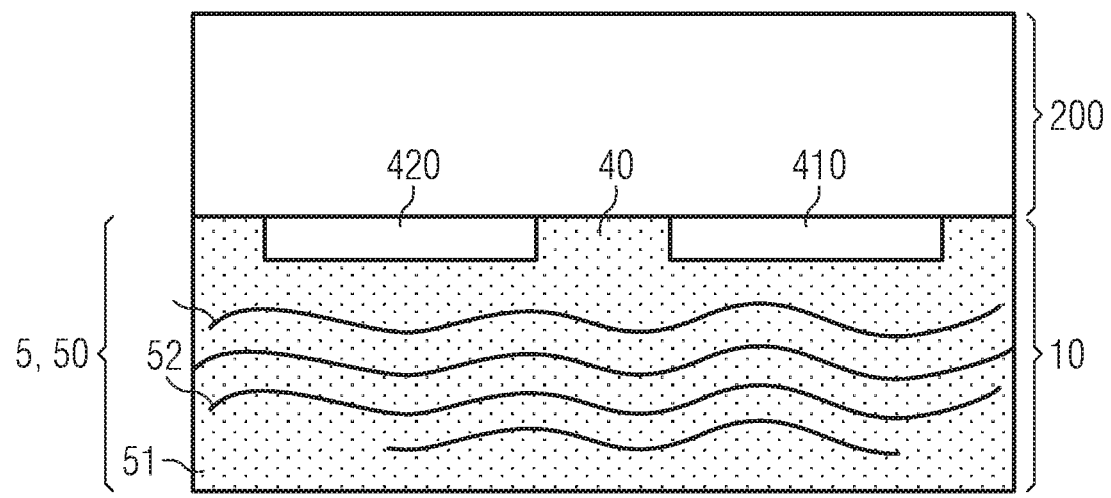
Figure 3A:
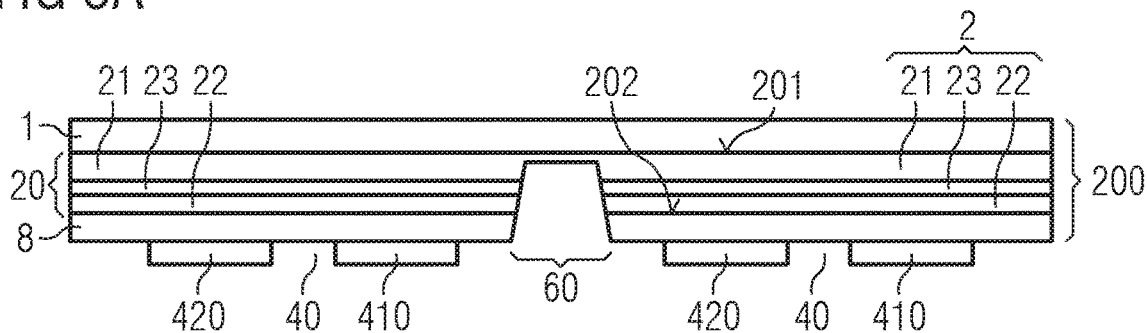
Figure 3B:
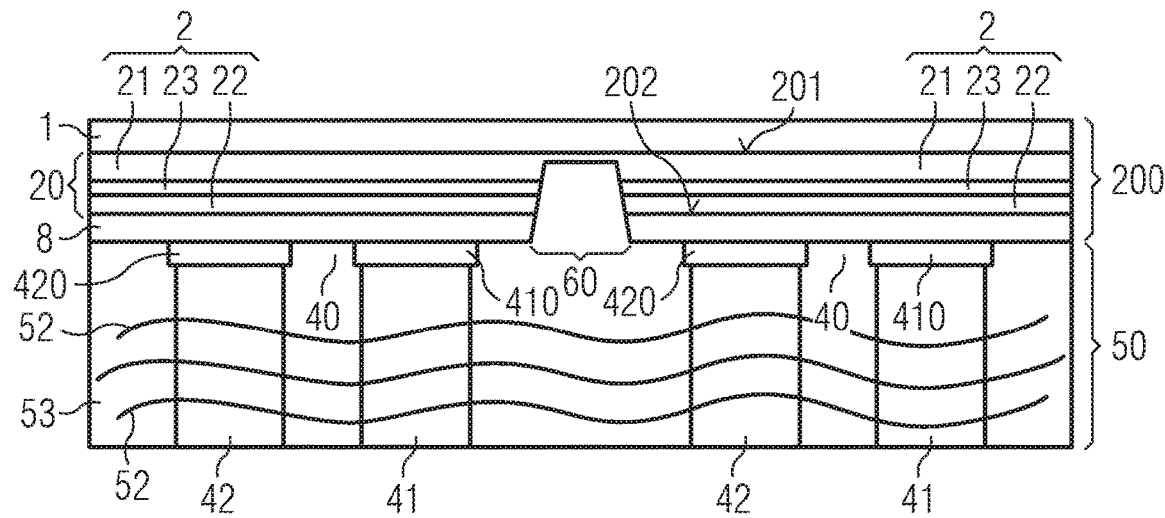
Figure 3C:
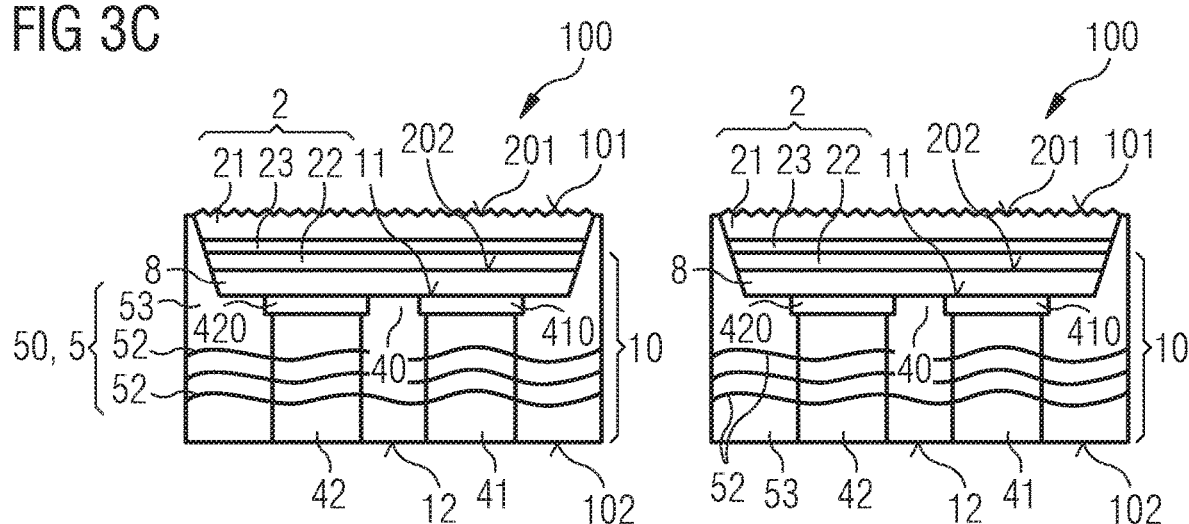

FIGS. 1A to 1F show different process stages of different embodiments for a method for producing a carrier or a component in schematic sectional views, FIGS. 2A to 2D show different process stages of a further exemplary embodiment for a method for producing a carrier or a component in schematic sectional views, FIGS. 3A to 3C show various process stages of an exemplary embodiment for a method for producing a plurality of components in schematic sectional views, and FIGS. 4A to 4B show different exemplary embodiments of a component in schematic sectional views.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

According to FIG. 1A, a composite structure 200 comprising a wafer composite 200, for instance a semi-processed wafer composite 200, is provided for the production of a carrier or a component. The composite structure 200 can also be an auxiliary carrier, on which the carrier is produced.

On the same side of its surface, the composite structure 200 has a first connection layer 410 and a second connection layer 420. The connection layers 410 and 420 are spaced apart from one another in the lateral direction by an intermediate region 40. The connection layers 410 and 420 are formed expediently from an electrically conductive material. In contrast to FIG. 1A, the composite structure 200 can comprise a plurality of first connection layers 410 and/or a plurality of second connection layers 420.

According to FIG. 1B, a mold body composite 50 is formed on the composite structure 200 for the formation of the carrier 10. The mold body composite 50 contains a plurality of reinforcing fibers 52 embedded in a matrix material 51. The reinforcing fibers 52 can be glass fibers or fabric fibers such as textile fibers. The reinforcing fibers 52 are arranged in the mold body composite 50 in such a way that, in a plan view, they have overlaps with the connection layers 410, 420 and/or with the intermediate region 40 in places. The mold body composite 50 comprising the matrix material 51 and the reinforcing fibers 52 embedded therein can be produced separately and applied to, for instance laminated on, the composite structure 200. In particular, the mold body composite 50 is composed of a photoactive circuit board material enforced with glass fibers. In FIG. 1B, the reinforcing fibers 52 are shown as loose fibers. In contrast thereto, the reinforcing fibers 52 can be mechanically connected to one another, for instance cross-linked or braided with one another. The reinforcing fibers 52 can also form a fiber bundle at least in regions.

The matrix material 51 is preferably a material which—with regard to the reinforcing fibers 52—can be selectively removed. This means that the matrix material can be selectively removed in regions, for example by exposure to light or by means of a solvent, for instance an etching agent, without the need for removing or resolving the reinforcing fibers 52. The matrix material 51 is preferably a photoactive lacquer which can be structured for instance by targeted irradiation. Alternatively, it is possible to select the matrix material 51 with regard to its properties in such a way that the matrix material 51 can serve as a mold body material of the to-be-produced mold body 5 of the carrier 10, wherein the matrix material 51 and the reinforcing fibers 52 are selected with regard to their materials in such a way that, with regard to the reinforcing fibers 52, the matrix material 51 is selectively removable.

According to FIG. 1C, a first opening 411 and a second opening 421 are formed in the mold body composite 50 by partially and selectively removing the matrix material 51. In the openings 411 and 421, the reinforcing fibers 52 and the associated connection layers 410 or 420 are exposed in regions. In particular, exposed surfaces of the connection layers 410 and 420 form bottom surfaces of the respective openings 411 and 421. The openings 411 and 421 thus extend along the vertical direction through the mold body composite 50 or through the mold body 5 to be produced. In the region of the respective opening, the reinforcing fibers 52 are arranged in a freely suspended manner. In the lateral direction, the reinforcing fibers 52 extend through the respective openings, penetrate into the matrix material 51 and thus are fixed to inner walls of the openings. In other words, the matrix material 51 holds the reinforcing fibers 52 together and fixes them in the lateral and in the vertical directions across the exposed volumes, i.e. across the openings 411 and 421, provided for the forming of the through-contacts. The openings 411 and 421 are thus each spanned by the reinforcing fibers 52.

According to FIG. 1D, the first opening 411 and the second opening 421 are filled with an electrically conductive material for forming a first through-contact 41 and a second through-contact 42, respectively. The through-contacts 41 and 42 can be applied to the connection layers 410 and 420 by a galvanic method. The reinforcing fibers 52 exposed in the openings 411 and 421 can thereby be surrounded by the electrically conductive material and thus be mechanically, in particular rigidly embedded within the electrically conductive material. Thus, after the formation of the through-contact or the through-contacts 41 and 42, the reinforcing fibers 52 penetrate into the respective through-contact. Thereby, the reinforcing fibers 52 can extend through the through-contacts/through-contact 41 and/or 42 along the lateral direction.

According to FIG. 1D, the carrier 10 to be produced has a front side 11 facing towards the composite structure 200 and a rear side 12 facing away from the front side 11. The front side 11 and the rear side 12 of the carrier 10 are formed in regions by surfaces of the mold body composite 50 or of the mold body 5. The through-contacts 41 and 42 extend along the vertical direction through the mold body composite 50. The through-contacts 41 and 42 thus extend from the rear side 12 as far as the front side 11 of the carrier 10. The through-contacts are thereby electrically connectable on the rear side 12 and/or on the front side 11 of the carrier 10. At the front side 11 of the carrier 10, the through-contacts 41 and 42 adjoin the first connection layer 410 and the second connection layer 420, respectively. It is possible that the matrix material 51 is configured to be selectively removable with respect to the reinforcing fibers 52 and can be used at the same time as a mold body material 53 of the mold body 5.

Should the matrix material 51 be unsuitable for the use as mold body material, after the formation of the through-contacts 41 and 42, the matrix material 51 can be removed for exposing further regions of the reinforcing fibers 52 and be replaced by an electrically insulating mold body material 53, for example, in a subsequent method step.

According to FIG. 1E, after the formation of the through-contacts 41 and 42, such a matrix material 51 is completely and in particular selectively removed. In this case, the matrix material 51 is preferably a photoactive lacquer which can be structured or removed, for example, by exposure to light. The remaining reinforcing fibers 52 are freely suspended outside the through-contacts 41 and 42. Here, they penetrate in regions into the first through-contact 41 and/or into the second through-contact 42. The reinforcing fibers 52 are thus arranged in regions in the first through-contact 41 and/or in the second through-contact 42 and are thereby held or fixed together by the through-contacts. According to FIG. 1E, a plurality of reinforcing fibers 52 span the intermediate region and thus connect the first through-contact 41 with the second through-contact 42.

According to FIG. 1F, a mold body material 53 is applied to the further exposed regions of the reinforcing fibers 52 in such a way that, for forming the mold body 5 of the carrier 10, the further exposed regions of the reinforcing fibers 52 are enclosed by the mold body material. Here, the mold body material 53 can directly adjoin the through-contacts 41 and 42, wherein the through-contacts 41 and 42 can be completely enclosed by the mold body material 53 in lateral directions. After the formation of the mold body 5, the reinforcing fibers 52 in each case are arranged in regions in the mold body 5 and in regions in at least one of the through-contacts 41 and 42 such that a mechanical connection is formed between the mold body 5 and the through-contact or the through-contacts 41 and 42 by the reinforcing fibers 52.

The mold body 5 can contain filling particles 54 for adjusting the thermal expansion coefficient of the carrier 10 to be produced, wherein the filling particles 54 are embedded in the mold body material 53 of the mold body 5. In particular, the filling particles 54 are selected with regard to their material in such a way that the thermal expansion coefficient of the mold body 5 and the composite structure 200, such as a semiconductor body composite structure 200, and/or the through-contacts 41 and 42 are adapted to each other. At a correspondingly high concentration of reinforcing fibers 52, the reinforcing fibers 52, however, can be chosen with regard to their materials in such a way that additional filling particles 54 can be dispensed with. This extends, for example, the possible options of the selection of mold body materials 53. The reinforcing fibers 52 and/or the filling particles 54 are selected with regard to their materials preferably in such a way that a total coefficient of thermal expansion of the carrier 10 is reduced in the presence of the reinforcing fibers 52 and/or of the filler particles 54.

The mold body material 53, optionally comprising the filling particles 54, can be fixed to the reinforcing fibers 52 and the through-contacts 41 and 42 by means of a casting method in particular under the influence of pressure. A casting method is understood to mean in general a method by which a molding compound can be formed according to a predefined shape preferably under the influence of pressure and, if necessary, cured. In particular, the term "casting method" includes molding, film-assisted molding, injection molding, transfer molding and compression molding.

FIGS. 2A to 2D show an exemplary embodiment for the formation of a mold body composite 50 or a mold body 5 on a composite structure 200. Here, the mold body composite 50 comprising the mold body material 51 is formed in layers on the composite structure 200 prior to the formation of the through-contacts 41 and 42. The mold body composite 50 and the mold body 5 are thus not produced separately but directly on the composite structure 200.

According to FIG. 2A, a first layer made of the matrix material 51 is applied to the composite structure 200. In a plan view, the connection layers 410 and 420 can be completely covered by the first layer made of the matrix material 51. The matrix material 51 can be a photoresist in the liquid or pasty state. The first layer made of the matrix material can be produced, for example, in the form of a photoresist paste or by spray coating on the composite structure 200, for example, with subsequent drying. In one subsequent process step, the reinforcing fibers 52 can be applied to the first layer for instance by placing and pressing, or can be pressed into the first layer (FIG. 2B). The reinforcing fibers 52 can be present loosely or can be mechanically connected to one another, for instance cross-linked or braided with one another. It is conceivable that the matrix material 51 can serve as a mold body material 53 of the mold body 5 which is to be produced.

According to FIG. 2C, a further layer of the matrix material 51 is applied to the first layer or to the reinforcing fibers 52. The application of the further layer of the matrix material 51 can be carried out, for example, by spray coating followed by a drying process. This can ensure a complete embedding of the reinforcing fibers 52 without the reinforcing fibers 52 losing their local position. Further reinforcing fibers 52 can be applied to the further layer or can be pressed into the further layer, whereupon additional layers made of the matrix material 51 and optionally comprising the reinforcing fibers 52 are applied to the further layer. The application of layers of the matrix material 51 and layers comprising the reinforcing fibers 52 or made of the reinforcing fibers 52 thus takes place alternately in layers.

The exemplary embodiment illustrated in FIG. 2D substantially corresponds to the exemplary embodiment illustrated in FIG. 1B. In contrast to this, according to FIG. 1B, the mold body composite 50 comprising the matrix material 51 and the reinforcing fibers 52 embedded therein is provided separately from the composite structure 200 in a prefabricated manner and is applied to the composite structure 200 by lamination, for example. According to FIGS. 2A to 2D, however, the mold body composite 50 is formed directly on the composite structure 200 in particular in layers. The alternating-layerwise applying of matrix material layers and the reinforcing fibers 52 can be performed using conventional photoresists, so that no dry resist comprising the reinforcing fibers 52 embedded therein has to be manufactured separately.

According to FIG. 3A, the composite structure 200 is formed as a wafer composite 200. The wafer composite 200 comprises a growth substrate 1 on which a semiconductor composite 20 is grown for instance epitaxially. The semiconductor composite 20 comprises a first, in particular n-conducting semiconductor layer 21 facing towards the growth substrate 1 and a second, in particular p-conducting semiconductor layer 22 facing away from the growth substrate 1. Furthermore, the semiconductor composite 20 contains an active layer 23 arranged between the first semiconductor layer 21 and the second semiconductor layer 22. The semiconductor composite 20 has a first main face 201 facing towards the growth substrate 1 and a second main face 202 facing away from the growth substrate 1. In particular, the main surfaces 201 and 202 are formed by surfaces of semiconductor layers 21 and 22 of the semiconductor composite 20.

The wafer composite 200 has a plurality of connection layers 410 and 420 on a surface facing away from the growth substrate 1. Deviating from FIG. 3A, the wafer composite can comprise a plurality of rows or columns of the connection layers 410 and 420. Furthermore, the wafer composite 200 comprises a wiring structure 8 for electrically contacting the semiconductor composite 20. The wiring structure 8 is arranged between the semiconductor composite 20 and the connection layers 410 and 420. The wiring structure 8 can have different partial regions which are electrically isolated from each other. By way of example, the first semiconductor layer 21 is electrically conductively connected to the first connection layer 410 via a first partial region of the wiring structure 8. The first partial region of the wiring structure 8 can be formed as a through-via which extends for instance from the second main surface 202 through the second semiconductor layer 22 and the active layer 23 into the first semiconductor layer 21. The second semiconductor layer 22 can be electrically connected to the second connection layer 420, for instance, via a further partial region of the wiring structure 8.

As illustrated in FIG. 3A, the semiconductor composite 20 can be divided into a plurality of semiconductor bodies 2, for example by forming one or a plurality of separating trenches 60. Along the lateral direction, the separating trench 60 extends for instance through the second main surface 202, the second semiconductor layer 22 and the active layer 23 into the first semiconductor layer 21. Deviating therefrom, the separating trench 60 can be formed in such a way that the separating trench extends through the entire semiconductor composite 20 along the vertical direction.

FIG. 3B shows a mold body composite 50 made of a plurality of reinforcing fibers 52 and the mold body material 53. The formation of the mold body composite 50 can be carried out according to one of the exemplary embodiments for a method for producing one or a plurality of carriers 10 or components 100 as shown in FIGS. 1A to 2D.

According to FIG. 3C, the growth substrate 1 is separated from the semiconductor composite 20. A thereby exposed surface of the semiconductor composite 20 is structured. The component 100 to be produced can thus have a structured radiation passage surface 101. According to FIG. 3C, the composite structure 200 in the form of a wafer composite 200 and the mold body composite 50 are singulated into a plurality of components 100 in such a way that the components 100 each have one of the semiconductor bodies 2, wherein the semiconductor body 2 is arranged on an associated carrier 10. The associated carrier 10 has an electrically insulating mold body 5 comprising at least one part of the mold body composite 50. The carrier 10 has an electrically conductive first through-contact 41 and an electrically conductive second through-contact 42. Furthermore, the carrier 10 has a plurality of reinforcing fibers 52 which are arranged in each case in regions in the mold body 5 and in regions in the first through-contact 41 and/or in the second through-contact 42 and thus establish a mechanical connection between the mold body 5 and the first through-contact 41 and/or the second through-contact 42.

According to FIG. 3C, the mold body composite 50 and the composite structure 200 are singulated for instance along the separation trench 60 or along the plurality of separating trenches 60, wherein the reinforcing fibers 52 can be severed during singulation. The components 100 arising therefrom can in each case have a carrier 10, the side faces of which have traces of the severed reinforcing fibers 52.

The component 100 illustrated in FIG. 3C can have a carrier 10 having reinforcing fibers 52, wherein the reinforcing fibers 52 extend in the lateral direction through the mold body 5 and through the through-contacts 41 and/or 42. The through-contacts 41 and 42 can be electrically connectable on a rear side 12 of the carrier 10 or on a rear side 102 of the component. The component 100 can thus be electrically contacted externally via the rear side 102, so that the component 100 is formed as a surface-mountable component.

According FIG. 3C, the semiconductor body 2 of the component 100 has side faces which extend along the vertical direction between the first main face 201 and the second main face 202. In the lateral directions, the side faces of the semiconductor body 2 are covered by the mold body material 53 of the mold body 5 at least in regions or completely.

FIG. 4A schematically shows an exemplary embodiment of a component 100. This exemplary embodiment substantially corresponds to the exemplary embodiment illustrated in FIG. 3C for a component. In contrast thereto, the wiring structure 8 is illustrated in somewhat greater detail. Also an isolation structure 9 of the component is illustrated in FIG. 4A. Furthermore, the component 100 as shown in FIG. 4A comprises a stabilization layer 3 which is arranged between the semiconductor body 2 and the carrier 10. In a top view of the carrier 10, the stabilization layer 3 bridges the intermediate region 40 located between the first through-contact 41 and the second through-contact 42 along the lateral direction.

The stabilization layer 3 is formed, in particular, in a contiguous manner. For example, the stabilization layer 3 has a layer thickness in the vertical direction between 5 μm and 50 μm inclusive, for instance between 5 μm and 30 μm inclusive or between 5 μm and 20 μm inclusive. The layer thickness is preferably at least 10 μm. Due to the stabilization layer 3, the component 100 is additionally mechanically reinforced in the intermediate region 40. However, it is also conceivable for the component 100 to be free of such a stabilization layer 3. In this case, the component 100 is formed preferably in such a way that the carrier 10 has a sufficiently large number of reinforcing fibers 52 in the intermediate region 40, so that also at locations of the intermediate region 40, sufficient mechanical stability of the component 100 is achieved by the reinforcing fibers 52 and their mechanical connection to the through-contacts 41 and 42.

The wiring structure 8 has a current spreading layer 80, an electrically conductive layer 81 and a through-via 82. The first through-contact 41 is electrically conductively connected to the first semiconductor layer 21 of the semiconductor body 2 via the first connection layer 410, the stabilization layer 3, the electrically conductive layer 81 and the through-via 82. The second through-contact 42 is electrically conductively connected to the second semiconductor layer 22 via the second connection layer 420 and the current spreading layer 80. The stabilization layer 3 is electrically isolated from the second connection layer 420 by the isolation structure 9. The current spreading layer 80 can be formed at the same time as a diffusion barrier layer and covers for instance an opening of the insulating layer 9 completely, wherein the second connection layer 420 extends through the opening. The current spreading layer 80 and the isolation structure 9 have a common opening in FIG. 4A, wherein the through-via 82 extends through the common opening for instance from the electrically conductive layer 81 as far as the semiconductor body 2.

The electrically conductive layer 81 is preferably formed as a mirror layer. In a plan view, the electrically conductive layer 81 covers the active layer 23 at least in regions. Sideways of the semiconductor body 2, the electrically conductive layer 81 can extend that far along the vertical direction that it laterally surrounds the second semiconductor layer 22 or the active layer 23. Electromagnetic radiation escaping the semiconductor body 2 sidewards or via the second main surface 202 can thus be reflected back in the direction of the active layer 23 or in the direction of the radiation passage area 101 of the component 100, so that the efficiency of the component 100 is increased.

FIG. 4B schematically illustrates a further exemplary embodiment of a component 100. This exemplary embodiment substantially corresponds to the exemplary embodiment for a component 100 illustrated in FIG. 4A. In contrast thereto, the through-via 82 extends through the stabilization layer 3. Here, the stabilization layer 3 and the isolation structure 9 have a common opening, wherein the through-via 82 extends through the common opening and is thus electrically insulated from the stabilization layer 3. While the electrically conductive layer 81 is formed contiguously according to FIG. 4A, the electrically conductive layer 81 according to FIG. 4B is subdivided into a first partial layer 811 and a second partial layer 812, wherein the partial layers 811 and 812 are laterally spaced apart from one another for instance in the region of the intermediate region 40 and thus are electrically isolated from each other. The partial layers 811 and 812 are electrically conductively connected to the first connection layer 410 and the second connection layer 420, respectively, and thus are associated with different electrical polarities of the component 100. According to FIG. 4B, the second partial layer 812 is electrically connected to the contiguous stabilization layer 3, while the first partial layer 811 is electrically insulated from the stabilization layer 3. Here, the stabilization layer 3 is completely enclosed by the isolation structure 9 in lateral directions.

This application claims the priority of German patent application 10 2015 115 722.5, the disclosure content of which is hereby included by reference.

The invention is not restricted to the exemplary embodiments by the description of the invention made with reference to the exemplary embodiments. The invention rather comprises any novel feature and any combination of features, including in particular any combination of features in the claims, even if this feature or this combination is not itself explicitly indicated in the patent claims or exemplary embodiments.

LIST OF REFERENCE NUMERALS

100 Component
101 Radiation passage surface
102 Rear side of the component
1 Growth substrate
10 Carrier
11 Front face of the carrier
12 Back side of the carrier
2 Semiconductor body
20 Semiconductor composite
200 Composite structure/wafer composite
201 First main surface of the semiconductor body
202 Second main surface of the semiconductor body
21 First semiconductor layer
22 Second semiconductor layer
23 Active layer
3 Stabilization layer
40 Intermediate region
410 First connection layer
420 Second connection layer
411 First opening
421 Second opening
41 First through-contact
42 Second through-contact
5 Mold body
50 Mold body composite
51 Matrix material
52 Reinforcing fiber
53 Mold body material
54 Filling particles
60 Separation trench
8 Wiring structure
80 Current spreading layer/diffusion barrier
81 Electrically conductive layer
811 1st partial layer of the electrically conductive layer
812 2nd partial layer of the electrically conductive layer
82 Through-via
9 Isolation structure

The invention claimed is:

1. A component comprising a semiconductor body arranged on a carrier having a mold body, a through-contact, and a plurality of reinforcing fibers, wherein
the mold body is formed from an electrically insulating mold body material,
the through-contact is formed from an electrically conductive material,
the reinforcing fibers are arranged in regions in the mold body and in regions in the through-contact, so that the reinforcing fibers establish a mechanical connection between the mold body and the through-contact,
the component is a light-emitting diode and has a wiring structure arranged in regions between the semiconductor body and the carrier along a vertical direction, and
at least some of the reinforcing fibers extend along a lateral direction throughout the through-contact.

2. The component according to claim 1, wherein the reinforcing fibers are mechanically connected to one another to form a web, and
wherein the web is located in the regions in the mold body and in the regions in the through-contact.

3. The component according to claim 1, wherein the reinforcing fibers are glass fibers.

4. The component according to claim 1, wherein the reinforcing fibers in the regions in the mold body are surrounded by the mold body material.

5. The component according to claim 1, wherein the mold body comprises filling particles for adjusting a thermal expansion coefficient of the carrier, and
wherein the filling particles are embedded in the mold body material.

6. The component according to claim 1, wherein the carrier comprises a front side and a rear side, which are formed by surfaces of the mold body, wherein the through-contact extends in the vertical direction from the rear side to the front side of the carrier, fully enclosed by the mold body material in lateral directions and is electrically connectable at the rear side of the carrier.

7. The component according to claim 1, which comprises the semiconductor body having an active layer, wherein
the semiconductor body is arranged on the carrier,
the active layer is configured for detecting or generating electromagnetic radiation during operation of the component,
the semiconductor body is electrically conductively connected to the through-contact, and
the component is electrically externally connectable via the carrier.

8. The component according to claim 7, further comprising a through-via which extends through the active layer for electrically contacting one semiconductor layer of the semiconductor body and is electrically conductively connected to the through-contact.

9. The component according to claim 7, further comprising a stabilization layer, wherein
the carrier comprises a first through-contact a second through-contact, and an intermediate region located in the lateral direction between the first and the second through-contacts, and
in a plan view of the carrier, the stabilization layer laterally bridges the intermediate region.

10. A method for producing a plurality of components each having a carrier, the method comprising:
a) providing a mold body composite having a plurality of reinforcing fibers embedded in a matrix material, the matrix material being a selectively structurable material;
b) forming at least one opening in the mold body composite by partial and selective removal of the matrix material such that the reinforcing fibers are exposed in regions and are freely suspended in a region of the at least one opening;
c) filling the at least one opening with an electrically conductive material for forming a through-contact, as a result of which the reinforcing fibers exposed in the region of the at least one opening are enclosed by the electrically conductive material so that, in a lateral direction, the reinforcing fibers penetrate into the through-contact;

d) providing a wafer composite comprising a semiconductor composite which is severable into a plurality of semiconductor bodies each comprising an active layer, wherein the mold body composite is applied on the wafer composite or formed in layers on the wafer composite such that the mold body composite is not produced separately but directly on the wafer composite, wherein a plurality of openings are formed in the mold body composite, wherein the plurality of openings are spanned by at least some of the reinforcing fibers so that along the lateral direction, at least some of the reinforcing fibers extend throughout the plurality of openings, penetrate into the matrix material and are fixed to inner walls of the plurality of openings, or wherein the through-contact is a first through-contact and the carrier further comprises a second through-contact, wherein an intermediate region is located in the lateral direction between the first through-contact and the second through-contact, and wherein at least some of the reinforcing fibers are located in places in the intermediate region and mechanically connect the first through-contact to the second through-contact; and e) wherein after forming the through-contact, the matrix material is completely removed for exposing further regions of the reinforcing fibers adjoining the through-contact, and the further exposed regions of the reinforcing fibers are refilled with an electrically insulating mold body material.

11. The method according to claim 10, in which the mold body composite is formed in layers prior to the forming of the through-contact, wherein a first layer of the matrix material is provided, the reinforcing fibers are applied to the first layer or pressed into the first layer, a further layer of the matrix material is applied to the first layer, and further reinforcing fibers are applied to the further layer or pressed into the further layer.

12. The method according to claim 10, wherein a photostructurable lacquer material is used as the selectively structurable material.

13. A method for producing a light-emitting diode having a carrier produced according to claim 10, a semiconductor body and a wiring structure arranged along a vertical direction in regions between the semiconductor body and the carrier, wherein the carrier is directly applied onto the semiconductor body or onto the wiring structure and thus is formed directly on the semiconductor body.

14. A component, comprising:

a semiconductor body having an active layer;

a carrier for an optoelectronic component having a mold body, a through-contact, and a plurality of reinforcing fibers; and a wiring structure arranged in regions between the semiconductor body and the carrier along a vertical direction; wherein the component is a light-emitting diode, the mold body is formed from an electrically insulating mold body material, the through-contact is formed from an electrically conductive material, the reinforcing fibers each are arranged in regions in the mold body and in regions in the through-contact, so that the reinforcing fibers establish a mechanical connection between the mold body and the through-contact, the semiconductor body is arranged on the carrier, the active layer is configured for generating electromagnetic radiation during operation of the component, the semiconductor body is electrically conductively connected to the through-contact, the component is electrically externally connectable via the carrier, and at least some of the reinforcing fibers extend along a lateral direction throughout the through-contact.

* * * * *